United States Patent
Chao et al.

(10) Patent No.: US 6,326,913 B1
(45) Date of Patent: Dec. 4, 2001

(54) INTERPOLATING DIGITAL TO ANALOG CONVERTER AND TFT-LCD SOURCE DRIVER USING THE SAME

(75) Inventors: Chin-Chieh Chao; Keh-Yung Tso; Jieh-Tsorng Wu; Tsen-Shau Yang, all of Hsinchu (TW)

(73) Assignee: Century Semiconductor, Inc., Hsinchu (TW)

( * ) Notice: Subject to any disclaimer, the term of this patent is extended or adjusted under 35 U.S.C. 154(b) by 0 days.

(21) Appl. No.: 09/559,991

(22) Filed: Apr. 27, 2000

(51) Int. Cl.[7] .................................................. H03M 1/66
(52) U.S. Cl. ................................................................ 341/144
(58) Field of Search ..................................... 341/144, 143, 341/155

(56) References Cited

U.S. PATENT DOCUMENTS 5,528,240 * 6/1996 Wilson et al. ....................... 341/143

* cited by examiner

*Primary Examiner*—Brian Young
(74) *Attorney, Agent, or Firm*—Darby & Darby (57) ABSTRACT

An interpolating D/A converter architecture includes a reference voltage generator, a decoding switch network, a routing switch, and an interpolating buffer. The reference voltage generator generates a plurality of reference voltages. The decoding switch network is coupled to the reference voltage generator for selecting two reference voltages from the plurality of reference voltages in response to the plurality of high bits of digital video signals. The routing switch is coupled to the decoding switch network for selectively providing a first reference voltage and a second reference voltage in response to a plurality of low bits of the digital video signals. And the interpolating buffer is coupled to the routing switch for outputting an interpolated analog signal in response to the first reference voltage and the second reference voltage. Eventually, the present invention can save half the D/A reference lines and half the associated decoding switch rows, and thereby save the die cost.

11 Claims, 14 Drawing Sheets

| D[2] | D[1] | V2' | V1' | VOUT |
|---|---|---|---|---|
| 0 | 0 | V1 | V1 | V1 |
| 0 | 1 | V1 | V2 | $\frac{S_2}{S_F} \times V1 + \frac{S_1}{S_F} \times V2$ |
| 1 | 0 | V2 | V1 | $\frac{S_1}{S_F} \times V1 + \frac{S_2}{S_F} \times V2$ |
| 1 | 1 | V2 | V2 | V2 |

| D[2] | D[1] | V2' | V1' | D[1] | V2' | VOUT |
|---|---|---|---|---|---|---|
| 0 | 0 | V1 | V1 | V1 | V1 | V1 |
| 0 | 1 | V2 | V1 | V1 | V1 | $V1+\frac{1}{4}(V2-V1)$ |
| 1 | 0 | V2 | V2 | V1 | V1 | $V1+\frac{2}{4}(V2-V1)$ |
| 1 | 1 | V2 | V2 | V2 | V1 | $V1+\frac{3}{4}(V2-V1)$ |

INTERPOLATING DIGITAL TO ANALOG CONVERTER AND TFT-LCD SOURCE DRIVER USING THE SAME

BACKGROUND OF THE INVENTION

A. Field of the Invention

The present invention relates to an interpolating D/A architecture for integrating a large number of D/As on a single chip, especially to an interpolating D/A architecture for a TFT-LCD source driver integrating a significant number of such D/As to reduce the cost of the driver IC.

B. Description of the Prior Art

Figure 1:
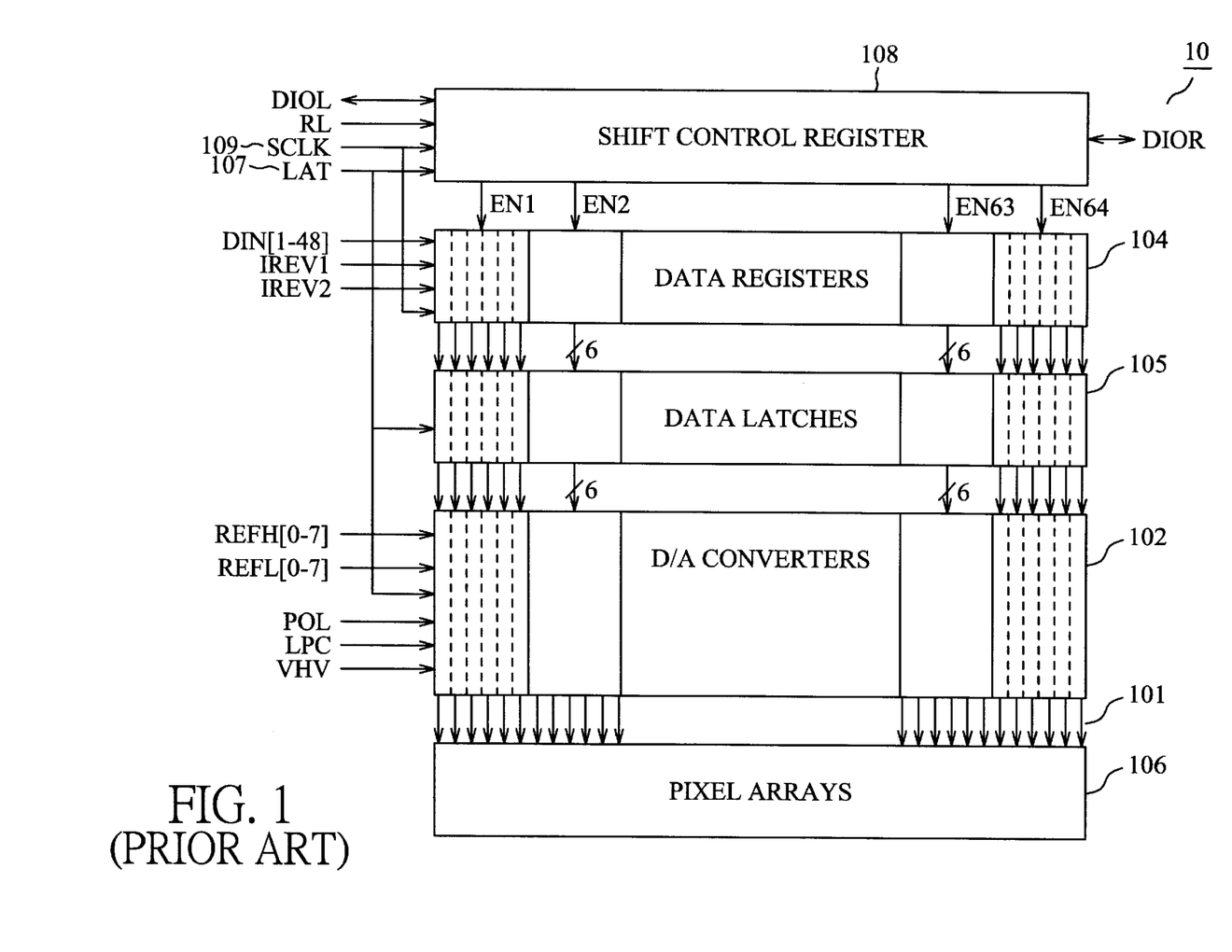
FIG. 1 is a block diagram showing the structure of a conventional TFT-LCD source driver.

A TFT-LCD Thin Film Transistor-Liquid Crystal Display source driver is a circuit that supplies video signals to an LCD pixel array. Refer to FIG. 1 for showing the structure of a conventional TFT-LCD source driver 10 with 384 output channels 101, each with an 8-bit resolution. A shift control register 108 is a bi-directional shift register, which sequentially enables the data registers 104 from the left side or the right side in response to the DIOL signal or the DIOR signal. A 48-bit input bus DIN[1-48], strobed synchronously by the rising edge of the SCLIK 109 signal, is used to serially load the 384 internal data registers 104. On each rising edge of the SCLK 109 signal, 6 data registers will be filled. After all of the data registers 104 are loaded, the contents of the data registers 104 are transferred to the data latches 105 when the LAT signal 107 is high. The outputs of the data latches 105 are converted by 384 8-bit digital to analog (D/A) converters 102 to drive the pixel arrays 106. Since the source driver 10 needs a large number of D/A converters 102, the area of the D/A converters 102 constitute a major portion of the overall cost budget of the source driver 10.

Figure 2:
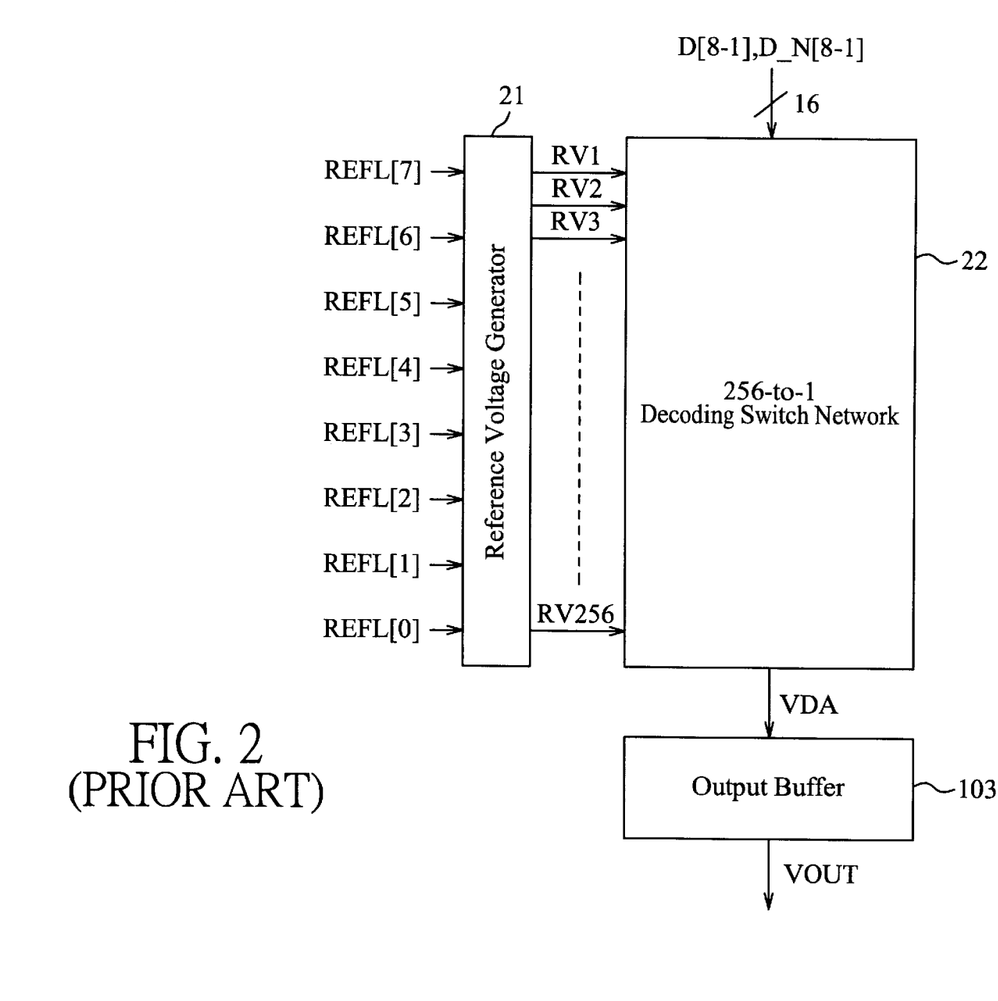
FIG. 2 is a block diagram showing the structure of a conventional 8-bit D/A converter.
Figure 3:
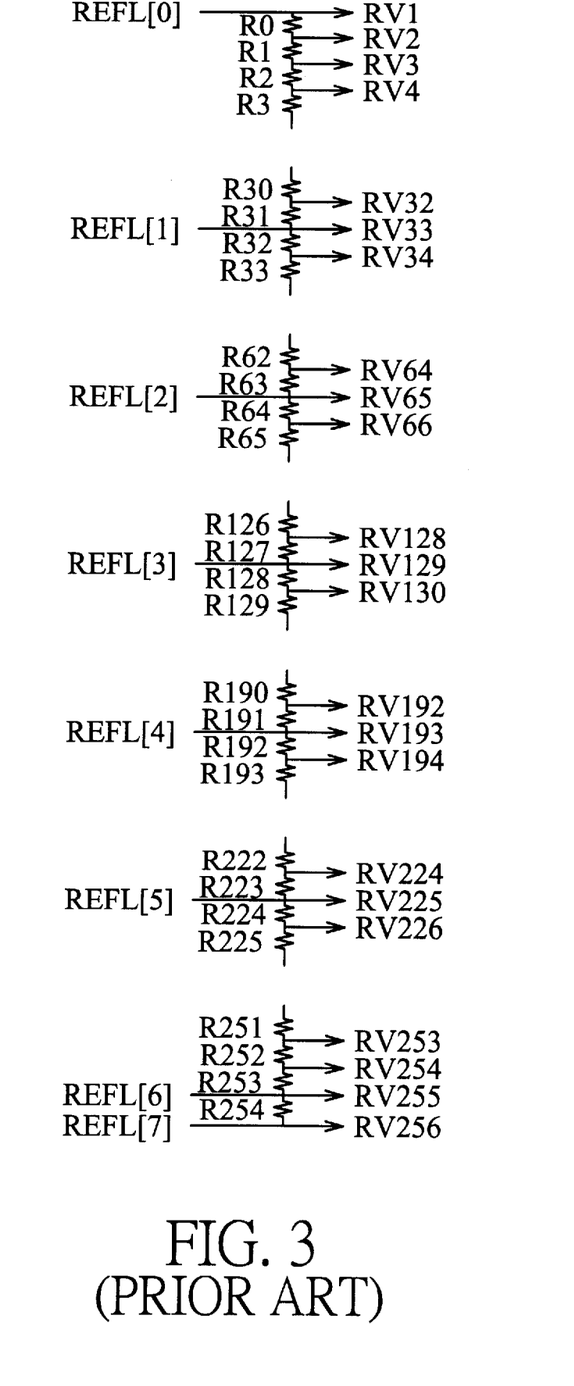
FIG. 3 is a schematic diagram showing the resistive reference voltage generator.
Figure 4:
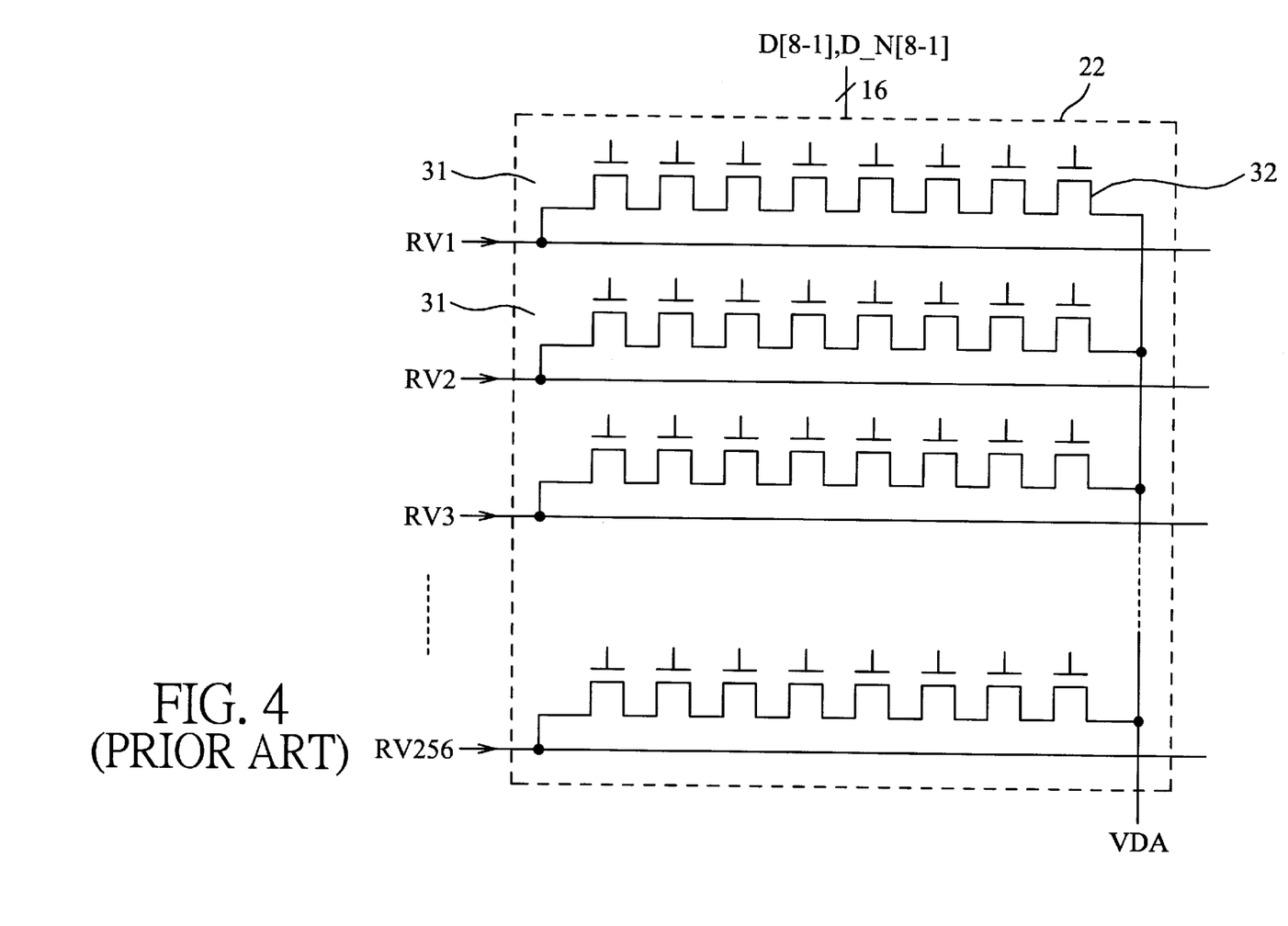
FIG. 4 is a schematic diagram showing the structure of a conventional 256-to-1 decoding switch network.
Figure 5:
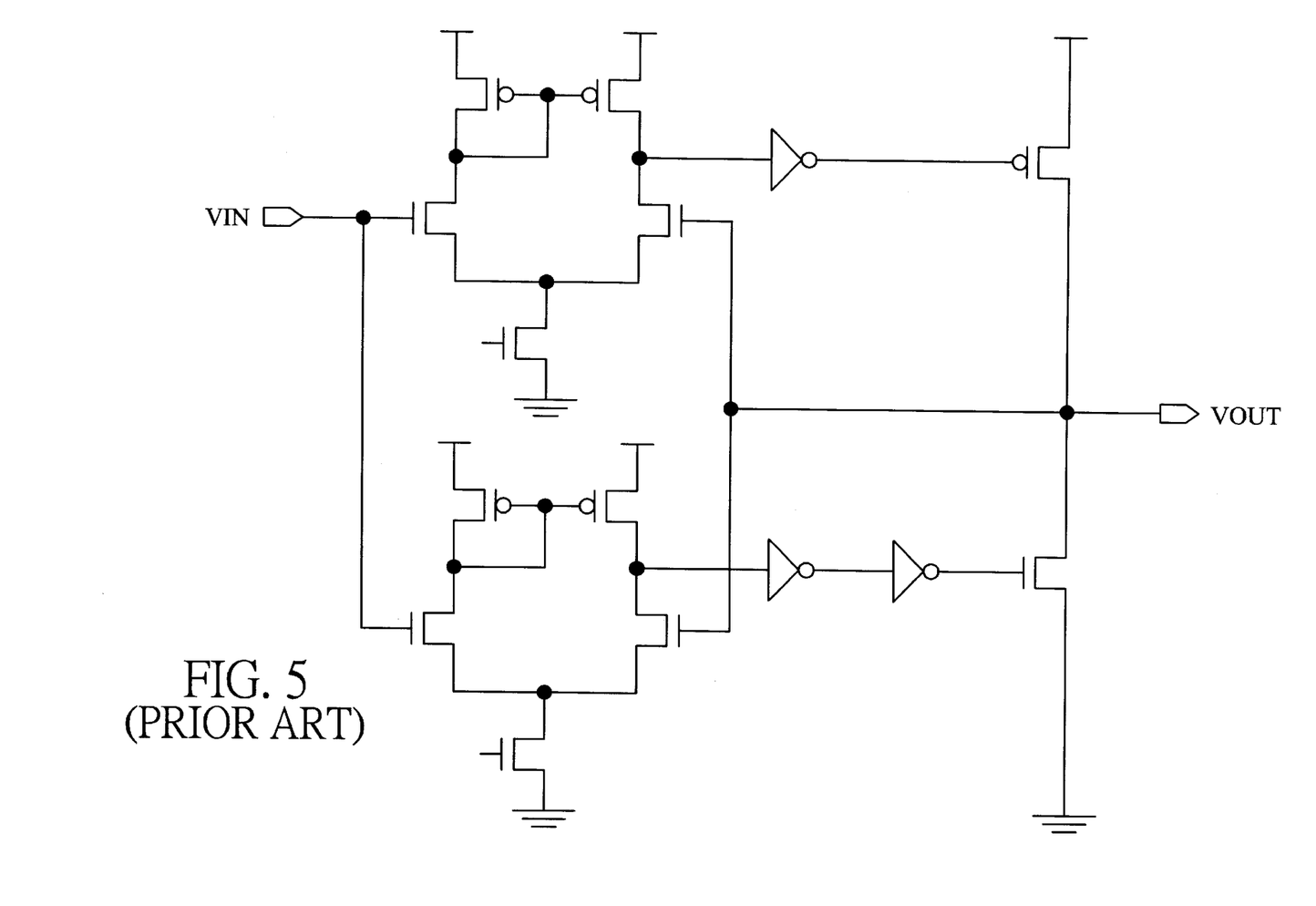
FIG. 5 is a schematic diagram showing the circuitry of a conventional output buffer.

FIG. 2 shows a more detailed block diagram of a prior art implementation of the D/A converters 102. It consists of a reference voltage generator 21, a decoding switch network 22, and an output buffer 103. The reference voltage generator 21 is shared among all outputs to save area. For an 8-bit D/A converter, 255 resistors are used to generate 256 reference levels as shown in FIG. 3. The resistances in the reference voltage generator 21 are not necessarily equal in value. Typically, they are carefully chosen so that the generated reference levels form a gamma-corrected transfer curve. The 256 global reference levels are typically routed with 256 horizontal metal lines over the decoding switch network 22. The decoding switch network 22 consists of 256 rows of switches 31, each with 8 serial transistors 32 as shown in FIG. 4. One of the 256 rows of switches 31 will connect the selected reference level to the output buffer 103. The schematic of a conventional output buffer 103 is shown in FIG. 5.

The major problem in the conventional source driver is the complexity and size of the decoding switches. The number of the horizontal metal lines and the number of rows of the serial switches 31 are so large that they usually occupy significant amount of die area, and therefore play a major role in determining the total cost of the chip. Moreover, conventional TFT applications with output polarity control need two sets of reference voltages, thus requiring 512 metal lines for an 8-bit resolution. With such an implementation, the D/A section will take up ⅓ of the overall chip area.

SUMMARY OF THE INVENTION

Accordingly, it is an objective of the present invention to provide an interpolating digital-to-analog converter for a TFT-LCD source driver that can reduce the number of the D/A reference lines without sacrificing the target resolution by using an interpolation technique in the output buffer stage, thereby saving the die cost of the TFT-LCD Source driver.

It is another objective of the present invention to provide an interpolating D/A converter architecture that is easy to implement and capable of saving the chip area by reducing half of the reference lines and half of the associated decoding switch rows.

It is yet still another objective of the present invention to provide an interpolating buffer, which is applicable to an interpolating D/A converter architecture for generating interpolated analog signals.

In accordance with the invention, the interpolating D/A converter architecture includes a reference voltage generator for generating a plurality of reference voltages. A decoding switch network is coupled to the reference voltage generator for selecting two reference voltages from the plurality of reference voltages in response to the plurality of high bits of digital video signals. A routing switch is coupled to the decoding switch network for selectively providing a first reference voltage and a second reference voltage in response to a plurality of low bits of the digital video signals. And an interpolating buffer is coupled to the routing switch for outputting an interpolated analog signal in response to the first reference voltage and the second reference voltage. Eventually, the present invention can save half the D/A reference lines and half of the associated decoding switch rows, and thereby save the die cost.

BRIEF DESCRIPTION OF THE DRAWINGS

These and other objectives and advantages of the present invention will become apparent by reference to the following description and accompanying drawings wherein.

DETAILED DESCRIPTION OF THE PREFERRED EMBODIMENTS

Since the major cost of the TFT-LCD source driver comes from the D/A reference lines and the associated decoding switch network, it would be possible to reduce the cost by implementing the desired D/A resolution in two stages. An example is illustrated in FIG. 6.

Figure 6:
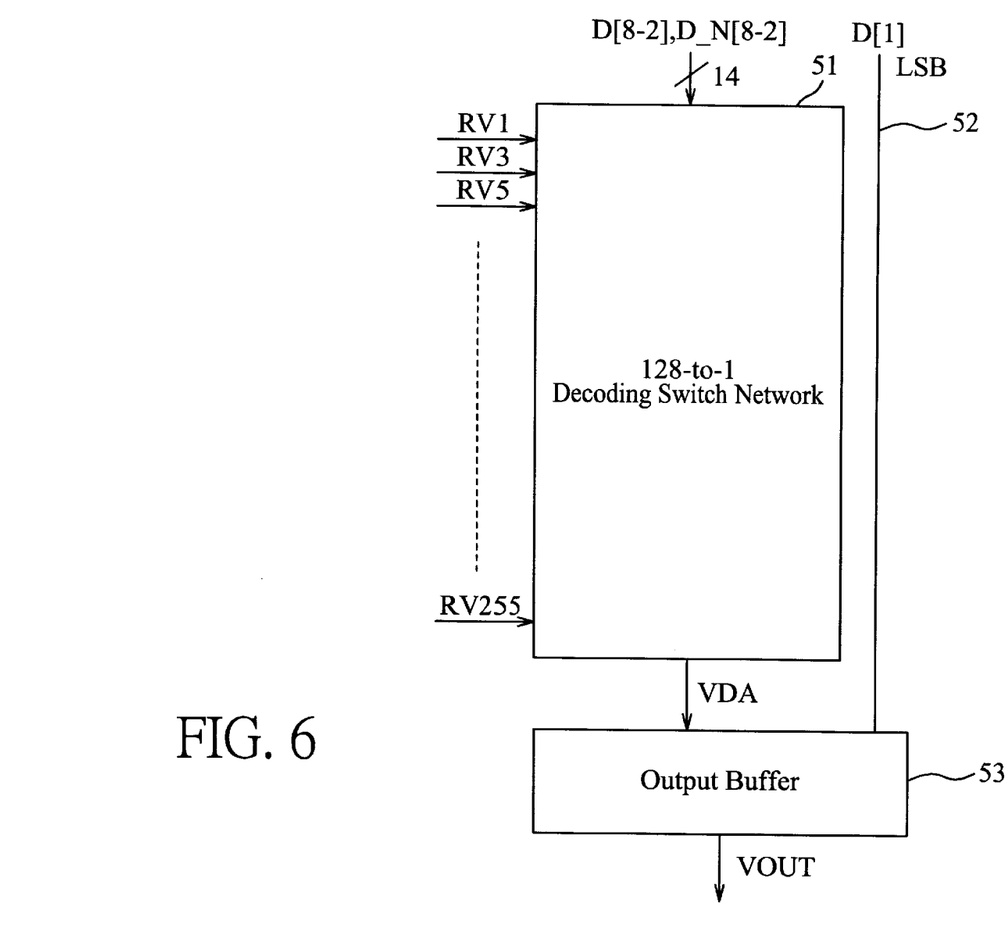
FIG. 6 is a block diagram showing a two-stage D/A converter architecture according to an embodiment of the present invention.
Figure 7:
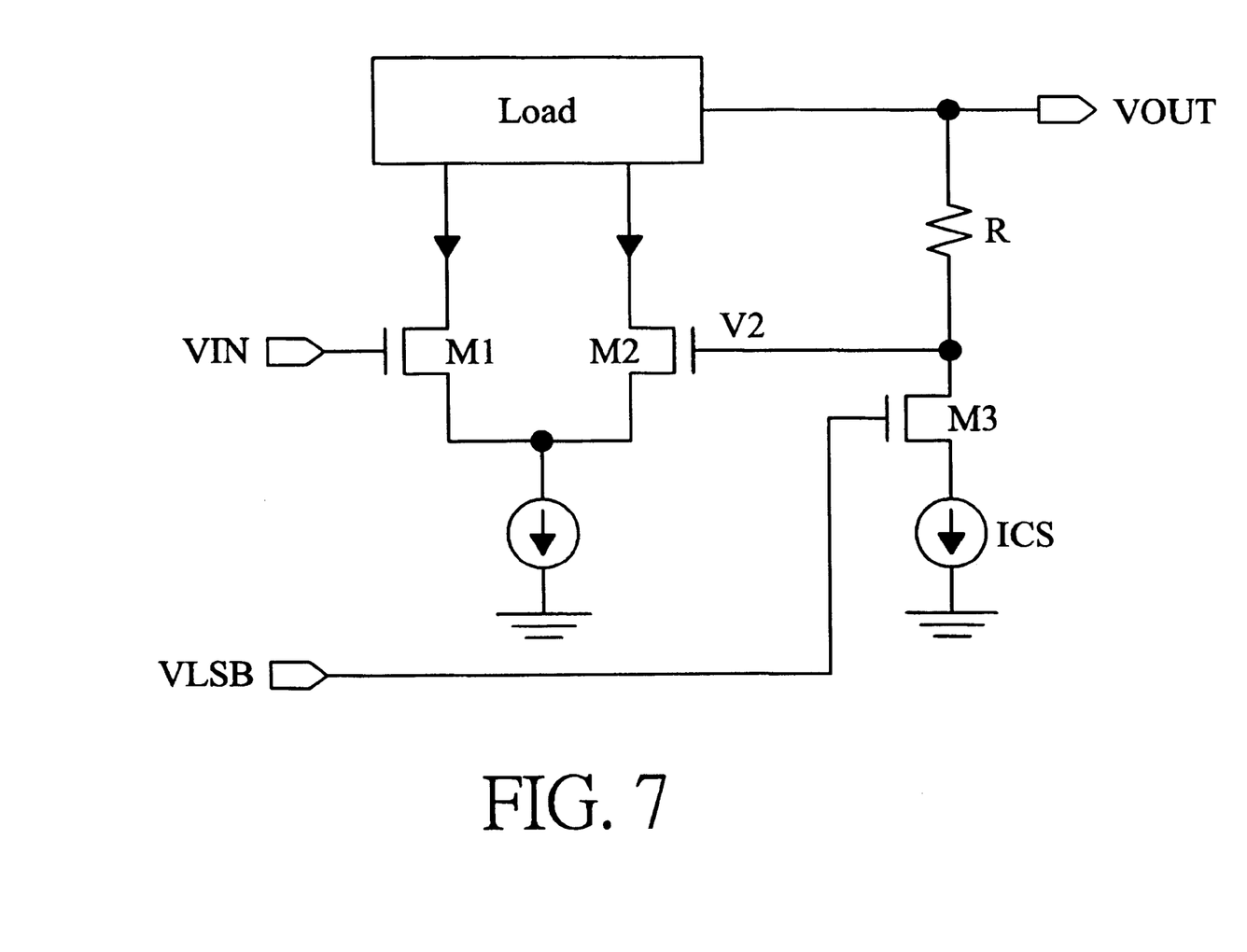
FIG. 7 is a schematic diagram showing an output buffer with an offset adjustment current switch.

Refer to FIG. 6, the target resolution of this embodiment is 8 bits. The number of reference lines of the decoding switch network 51 is reduced to 128 by implementing the LSB 52 with an additional current switch at the output of the output buffer 53 as shown in FIG. 7. Accordingly, half of reference lines (RV2, RV4 . . . ) are skipped and can be interpolated in response to the selection of LSB 52 in the output buffer 53. The tradeoff for this embodiment is that the output-to-output deviations can be large due to the mismatches of the LSB current sources among all D/As. Moreover, in TFT-LCD applications, the voltage levels corresponding to the LSB 52 are not uniformly spaced due to gamma correction. As a consequence, additional current switches need to be added to segment the LSB current source. It inevitably increases the complexity of the LSB current switch circuits and complicates the implementation. Following the same train of thought, the number of reference lines can be reduced further by using only 64 reference lines and by implementing the last two bits using similar current switches at the buffer amplifier stage. However, this may suffer from poorer D/A linearity and larger output-to-output deviations.

Figure 8:
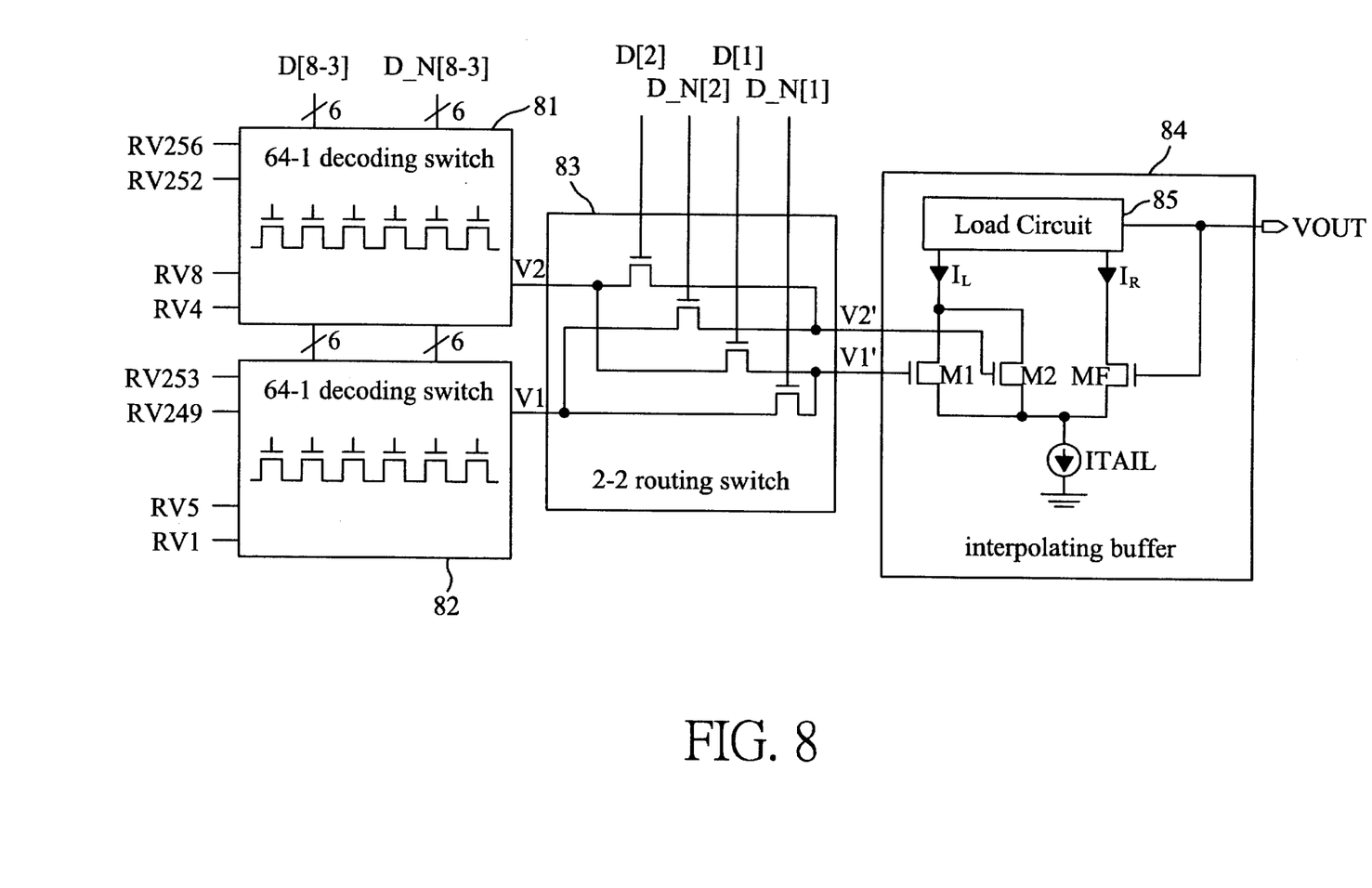
FIG. 8 is a schematic diagram showing the structure of an 8-bit D/A converter architecture according to the preferred embodiment of the present invention.

Accordingly, the present invention provides a D/A converter architecture having an interpolating buffer 84 as shown in FIG. 8. Refer to FIG. 8, the D/A converter mainly includes two 64-1 decoding switches 81, 82, a 2-2 routing switch 83 coupled to the set of 64-1 decoding switches 81, 82, and an interpolating buffer 84 for generating an interpolated analog signal Vout.

The 64-1 decoding switches 81, 82 work as a pair. The two 64-1 decoding switches 81, 82 receive inputs from two sets of 64 reference lines, (RV1, RV5, . . . , RV249, RV253) and (RV4, RV8, . . . , RV252, RV256), and generate reference levels V1 and V2 for interpolating the skipped reference levels (RV2, RV6, . . . , RV250, RV254) and (RV3, RV7, . . . , RV251, RV255).

A 2-2 routing switch 83 is coupled to the decoding switches 81, 82 for receiving the reference voltages V1 and V2 generated by the decoding switches 81, 82 respectively. In response to the selection of the low bits D[1] and D[2] of the digital video signals, the 2-2 routing switch 83 selectively generates two reference voltages V1' and V2', which can be one of the four possible combinations: (V1, V1), (V1, V2), (V2, V1), and (V2, V2).

An interpolating buffer 84 is coupled to the 2-2 routing switch 83 for receiving the two reference voltages V1', V2' and generating an interpolated analog signal Vout. The interpolating buffer 84 includes two input transistors M1 and M2, one feedback transistor MF, a shared current source ITAIL, and a load circuit 85. A transistor M1 receives a reference voltage V1' from its gate. A transistor M2 receives a reference voltage V2' from its gate. A transistor MF is electrically coupled to the output terminal of the load circuit 85 from its gate. The load circuit 85 has two input terminals coupled to the shared drain of M1 and M2, and the drain of MF, and its output coupled to the gate of MF. The purposes of the load circuit 85 are two folds: it provides current to voltage conversion and differential to single-end conversion. The shared current source ITAIL has one terminal coupled to a fixed voltage level and the other terminal electrically coupled to the sources of the transistors M1, M2, and MF. The interpolating buffer 84 is characterized by having a fixed relationship among the drawn geometries of transistors M1, M2, and MF. Let S=W/L, the transistors are sized such that $S_1+S_2 = mS_F$ where m is an arbitrary positive number, L represents transistor channel length and W channel width. The load circuits 85 are designed such that $I_L = nI_R$ in the steady state, where n is another arbitrary positive number. Without loss of generality, it will be assumed that n=m=1 in the following derivation. In the steady state, $$S_1 \times V_{G1}^2 + S_2 \times V_{G2}^2 = S_F \times V_{GF}^2, \quad (1)$$

where $V_G 1$, $V_G 2$, and $V_G F$ are the gate drives of the respective transistors.

Let $V_G 2 = V_G 1 + \Delta V$ and assume $\Delta V \ll V_G 1, V_G 2$. Equation (1) becomes:

$$S_1 \times V_{G1}^2 + S_2 \times (V_{G1} + \Delta V)^2 = S_F \times V_{GF}^2. \quad (2)$$

Since $\Delta V \ll V_G 1$, $V_G 2$ and $S_F = S_1 + S_2$, equation (2) can be reduced to $$V_{GF}^2 \approx V_{G1}^2 \times \left(1 + 2 \times \frac{S_2}{S_F} \times \frac{\Delta V}{V_{G1}}\right). \quad (3)$$

Taking a Taylor series approximation, equation (3) will be $$V_{GF} \approx V_{G1} + \frac{S_2}{S_F} \times \Delta V. \quad (4)$$

Therefore $$V_{out} \approx V_1' + \frac{S_2}{S_F} \times (V_2' - V_1') \quad (5)$$

Equation (5) suggests that the interpolation result is linear if the gate drives of transistors M1, M2, and MF are made much larger than the difference between the voltage levels to be interpolated. Furthermore, the interpolated voltage level can be adjusted by simple transistor sizing.

Figure 9:
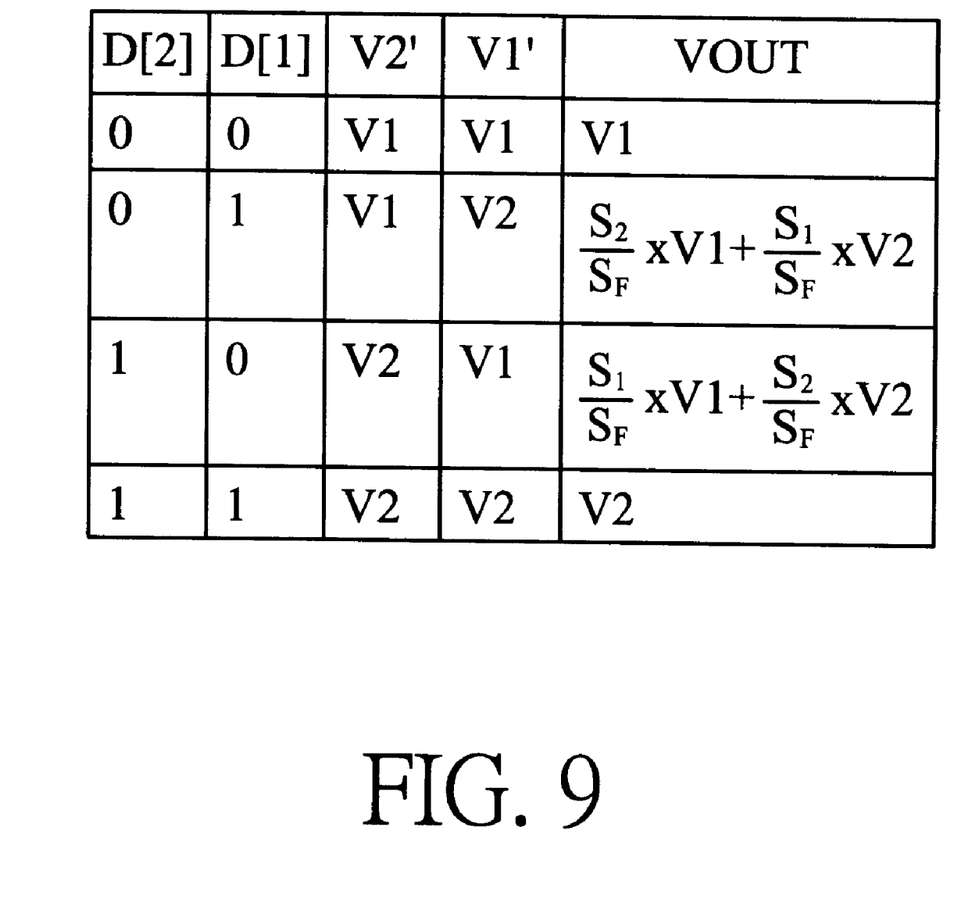
FIG. 9 is a table showing the interpolated voltage levels with the 2-2 routing switch and the 2-input interpolating buffer in FIG. 8.

Accordingly, the D/A converter architecture as illustrated in FIG. 8 can generate an interpolated analog signal in response to the two reference levels V1 and V2. Based on the 2-2 routing switch 83 and the interpolating buffer 84, there are four possible combinations as illustrated in FIG. 9. When D[2] and D [1] are both equal to 0, Vout will be equal to V1. On the other hand, when D[2] and D[1] are both equal to 1, Vout will be equal to V2. The intermediate voltages will be interpolated when D[2] and D[1] do not have the same value. When D[2] is equal to 0, and D[1] is equal to 1, the voltage of Vout is interpolated to be $$\frac{S_2}{S_F} \times V1 + \frac{S_1}{S_F} \times V2.$$

And when D[2] is equal to 1, and D[1] equal to 0, the voltage of Vout is interpolated by $$\frac{S_1}{S_F} \times V1 + \frac{S_2}{S_F} \times V2.$$

The two reference voltages V1 and V2 are then interpolated to generate 4 levels. Each decoding switch 81, 82 has a 6-bit resolution. Two such decoding switches achieve a 7-bit resolution. The 2-2 routing, switch 83 and the interpolating buffer 84 provide the 8th-bit resolution. Thus, the new architecture as illustrated in FIG. 8 can successfully reduce the number of reference lines from 256 to 128, and reduce the number of MOS switch rows from 256 to 128, and reduce the number of serial MOS transistors from 8 to 7. Overall, the new architecture improves in both area and speed over the prior art architecture.

Figure 10:
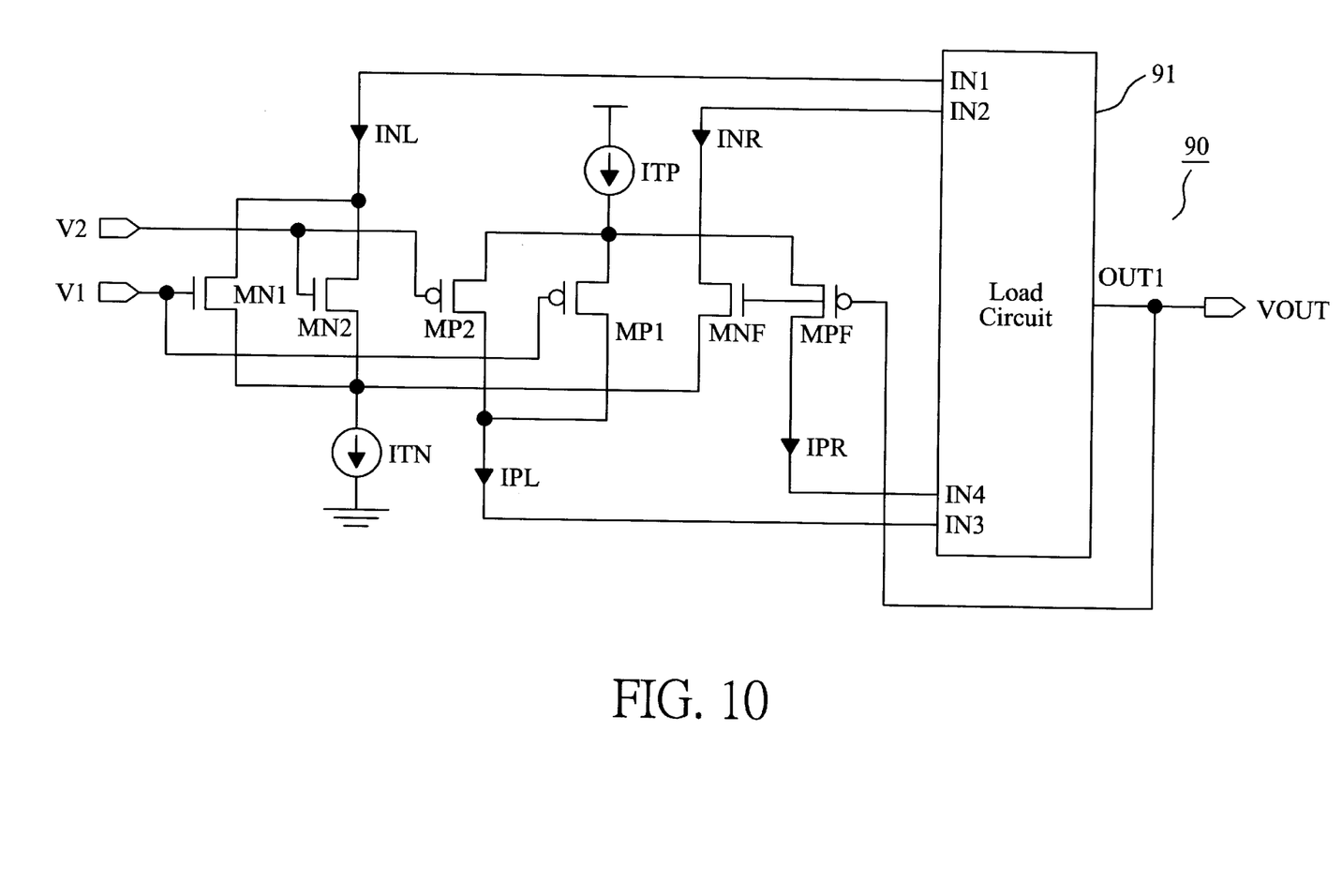
FIG. 10 is a schematic diagram of an interpolating buffer with rail-to-rail input stage.

It should be understood that the interpolation scheme is not limited to NMOS-input buffer only but also PMOS-input buffer or rail-to-rail input buffer. The schematic of an interpolating buffer with rail-to-rail input is shown in FIG. 10. Refer to FIG. 10, the rail-to-rail input buffer 90 mainly includes two current sources ITN and ITP, a load circuit 91, a first set of transistors consisting of MN1, MN2, and MNF, and a second set of transistors consisting of MP1, MP2, and MPF. The transistor MN1 receives the reference voltage V1 from its gate terminal. The transistor MN2 receives the reference voltage V2 from its gate terminal. The load circuit 91 has an input terminal IN1 coupled to a drain terminal of the transistor MN1 and a drain terminal of the transistor MN2. A transistor MNF is coupled to an output terminal OUT1 of the load circuit 91 from its gate terminal and to an input terminal IN2 of the load circuit 91 from its drain terminal. A first terminal of the current source ITN is coupled to a fixed voltage level. A second terminal of the current source ITN is coupled to a source of the transistor MN1, a source of the transistor MN2, and a source of the transistor MNF. A transistor MP1 receives the reference voltage V1 from its a gate terminal. The drain terminal of the transistor MP1 is coupled to an input terminal IN3 of the load circuit 91. The transistor MP2 receives the reference voltage V2 from its gate terminal. The drain terminal of the transistor MP2 is coupled to the input terminal IN3 of the load circuit 91. The transistor MPF is coupled to the output terminal OUT1 of the load circuit 91 from its gate terminal. The drain terminal of the transistor MPF is coupled to an input terminal IN4 of the load circuit 91. The current source ITP is coupled to a fixed voltage level from a first terminal and to the sources of the transistors MP1, MP2, and MPF from a second terminal.

Figure 11:
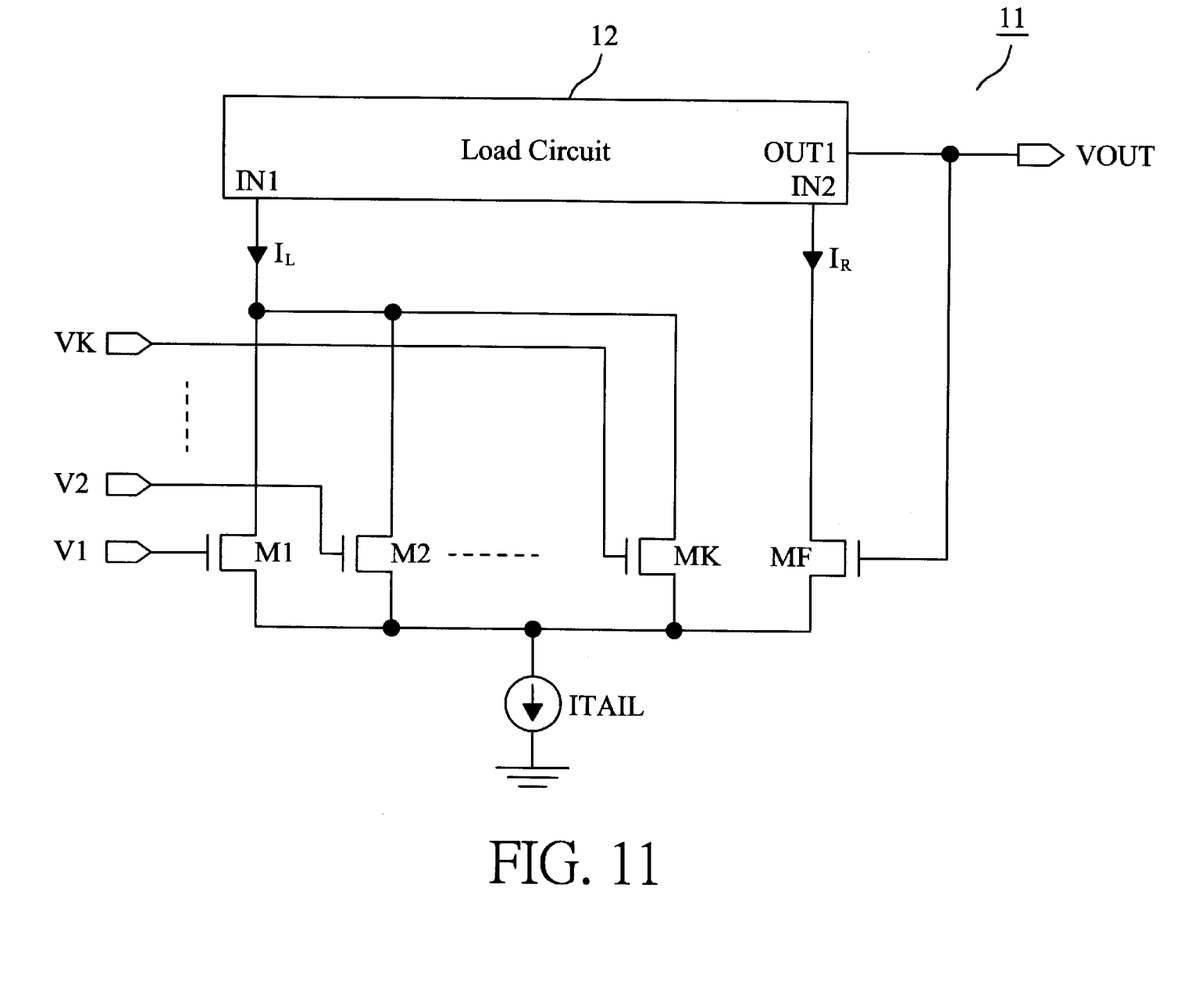
FIG. 11 is a schematic diagram of a k-input interpolating buffer.

Furthermore, interpolating an arbitrary number of levels from an arbitrary number of references is possible as depicted in FIG. 11. Refer to FIG. 11, the interpolating buffer 11 mainly includes a load circuit 12, a current source ITAIL, a plurality of transistors M1, M2, ..., MK, and a feedback transistor MF. A plurality of transistors each has a gate terminal for receiving a reference voltage from a plurality of K reference voltages. The load circuit 12 has an input terminal IN1 coupled to each drain terminal of the plurality of transistors M1, M2..., MK. The feedback transistor MF has a gate terminal coupled to the output terminal OUT1 of the load circuit 12, and a drain terminal coupled to the input terminal IN2 of the load circuit 12. The current source ITAIL has a first terminal coupled to a fixed voltage level and a second terminal electrically coupled to each source terminal of the plurality of transistors M1, M2..., MK and a source terminal of the feedback transistor MF.

Transistor sizing and load circuit design are very similar to the 2-input interpolating buffer shown in FIG. 8, i.e. $S_1+S_2+ \ldots +S_K=mS_F$, and $I_L=nI_R$ in the steady state. Without loss of generality, assuming $n=m=1$ the following relationship can be derived:

$$V_{out} \approx V_1 + \frac{S_2}{S_F}(V_2-V_1) + \frac{S_3}{S_F}(V_3-V_1) + \ldots + \frac{S_K}{S_F}(V_K-V_1) \quad (6)$$

Figure 12:
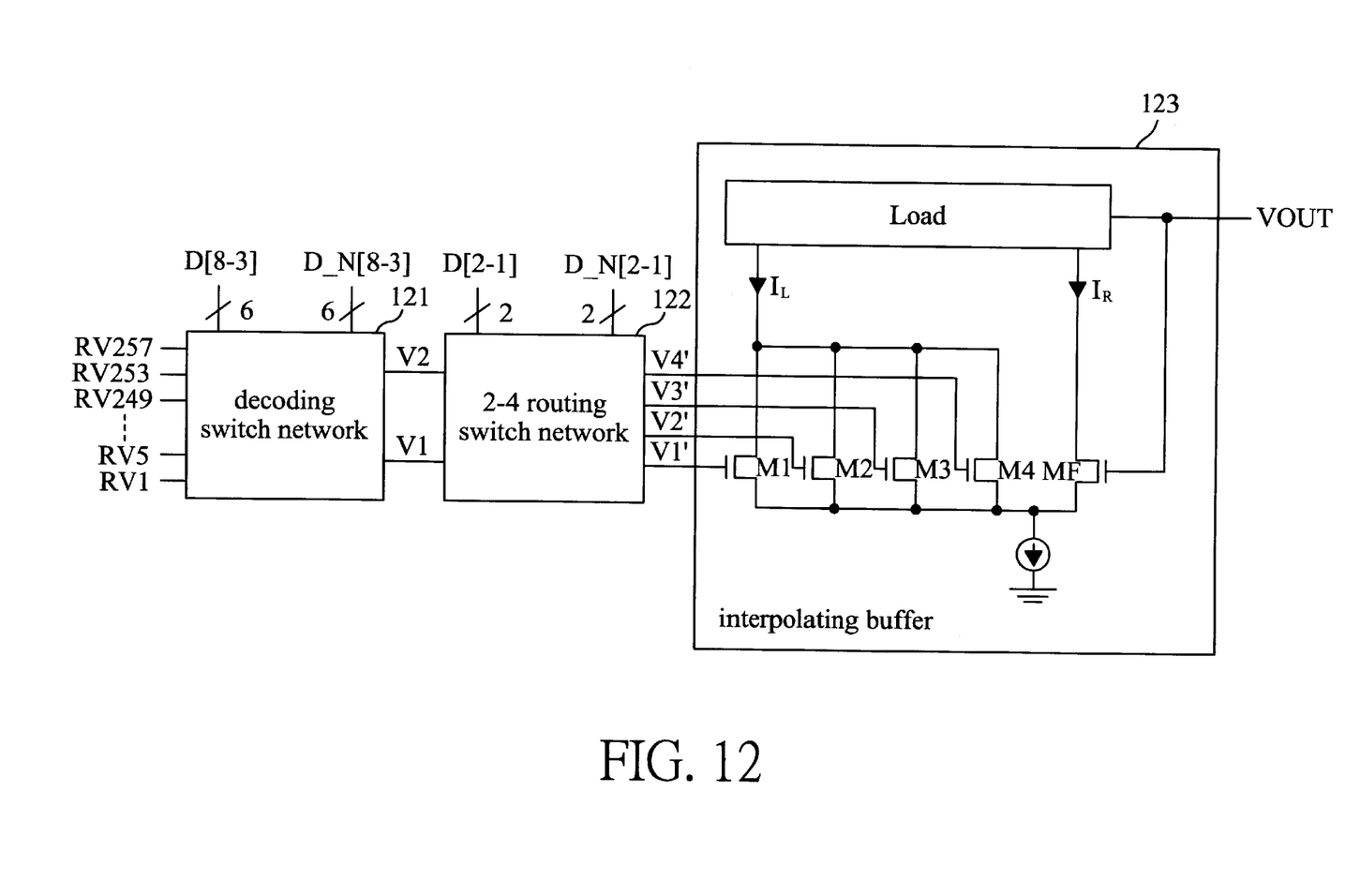
FIG. 12 is a schematic diagram showing the structure of another 8-bit D/A converter architecture utilizing a 4-input interpolating buffer.
Figure 13:
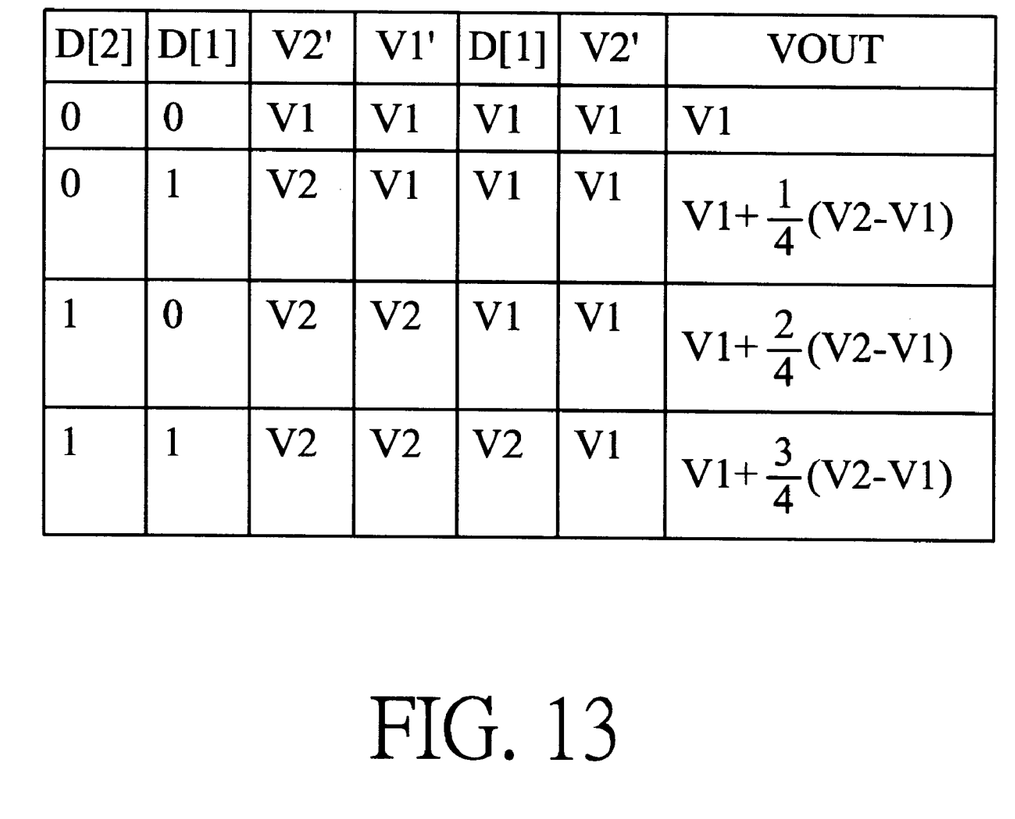
FIG. 13 is a table showing the interpolated voltage levels with the 2-4 routing switch and the 4-input interpolating buffer in FIG. 12.

An example D/A converter using a multiple-input interpolation buffer is shown in FIG. 12. A decoding switch network 121 receives 65 reference lines and generates two outputs: V1 and V2. A 2-4 routing switch 122 is coupled to the decoding switch network 121 to receive V1 and V2 and produces V1', V2', V3', and V4' as the outputs. A 4-input interpolating buffer 123 is coupled to the 2-4 routing switch 122 and generates an interpolated voltage level Vout. If it is assumed that $S_1=S_2=S_3=S_4=S_F/4$, and $I_L=I_R$ in the steady state, then the interpolated voltage levels with the 2-4 routing switch 122 and the 4-input interpolating buffer 123 can be summarized in FIG. 13.

Figure 14:
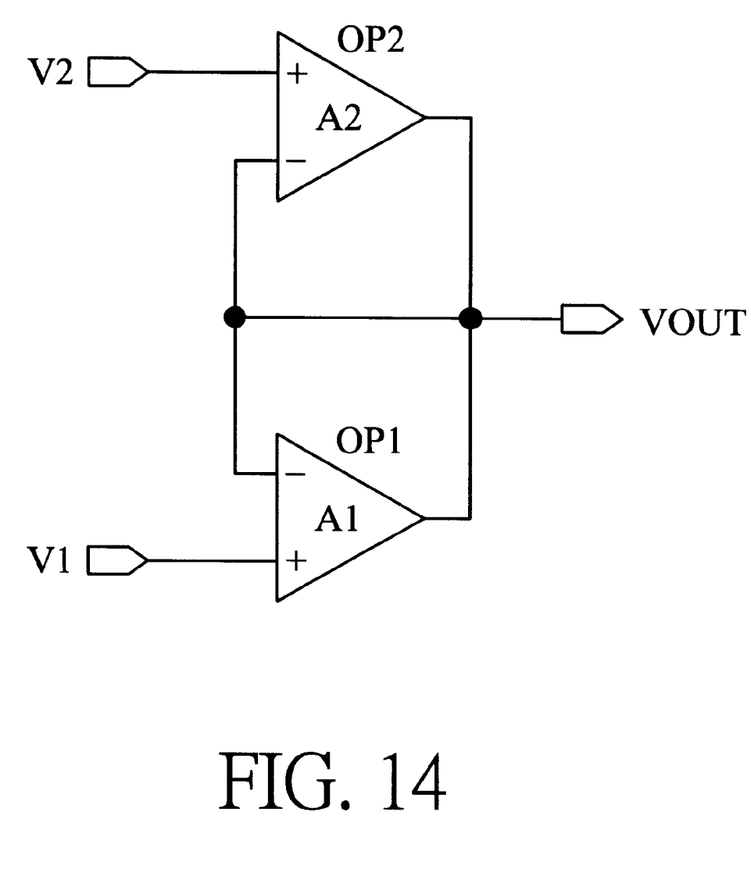
FIG. 14 is a schematic diagram showing an alternative implementation of the interpolating buffer.

There are various possible embodiments of the interpolating buffer. Refer to FIG. 14 for showing another interpolation example which is done at the output of the buffer amplifier by simply wire-oring, the outputs of operational amplifier OP1 and operational amplifier OP2. OP1 has a positive input terminal for receiving a reference voltage V1 and a negative input terminal for coupling to its own output terminal. OP2 has an output terminal coupled to the output terminal of OP1. The positive input terminal of OP2 receives the reference voltage V2. The negative input terminal of OP2 is coupled to the output terminal of OP1. The interpolated output level can be shown to be $$\frac{A1 \times V_1 + A2 \times V_2}{A1+A2+1},$$

where A1 is the open-loop gain of OP1, and A2 is the open-loop gain of OP2.

While this invention has been described with reference to an illustrative embodiment, this description is not intended to be construed in a limiting sense. Various modifications and combinations of the illustrative embodiment, as well as other embodiments of the invention, will be apparent to persons skilled in the art upon reference to the description. It is therefore intended that the appended claims encompass any such modifications or embodiments.

What is claimed is:

1. An interpolating digital-to-analog converter for a TFT-LCD source driver comprising:
    a reference voltage generator for generating a plurality of reference voltages;
    a decoding switch network coupled to said reference voltage generator for selecting two reference voltages from said plurality of reference voltages in response to a plurality of high bits of a plurality of digital video signals;
    a routing switch coupled to said decoding switch network for selectively providing a first reference voltage and a second reference voltage in response to two low bits of said plurality of digital video signals; and
    an interpolating buffer coupled to said routing switch for outputting an interpolated analog signal in response to said first reference voltage and said second reference voltage.

2. The interpolating digital-to-analog converter for a TFT-LCD source driver as claimed in claim 1, wherein said interpolating buffer comprises:
    a first transistor having a gate terminal for receiving said first reference voltage;
    a second transistor having a gate terminal for receiving said second reference voltage;
    a load circuit with a first input terminal coupled to a drain terminal of said first transistor and a drain terminal of said second transistor;
    a third transistor having a gate terminal for coupling to an output terminal of said load circuit and having a drain terminal coupled to a second input terminal of said load circuit; and
    a current source having a first terminal coupled to a fixed voltage level and a second terminal electrically coupled to a source terminal of said first transistor, a source terminal of said second transistor and a source terminal of said third transistor.

3. The interpolating digital-to-analog converter for a TFT-LCD source driver as claimed in claim 1, wherein said interpolating buffer comprises:

a first transistor having a gate terminal for receiving said first reference voltage;

a second transistor having a gate terminal for receiving said second reference voltage;

a load circuit with a first input terminal coupled to a drain terminal of said first transistor and a drain terminal of said second transistor;

a third transistor having a gate terminal for coupling to an output terminal of said load circuit and having a drain terminal coupled to a second input terminal of said load circuit;

a first current source having a first terminal coupled to a fixed voltage level and a second terminal coupled to a source of said first transistor, a source of said second transistor, and a source of said third transistor;

a fourth transistor having a gate terminal for receiving said first reference voltage and having a drain terminal coupled to a third input terminal of said load circuit;

a fifth transistor having a gate terminal for receiving said second reference voltage and having a drain terminal coupled to said third input terminal of said load circuit;

a sixth transistor having a gate terminal for coupling to said output terminal of said load circuit and having a drain terminal coupled to a fourth input terminal of said load circuit; and a second current source having a first terminal coupled to a fixed voltage level and a second terminal coupled to a source of said fourth transistor, a source of said fifth transistor, and a source of said sixth transistor.

4. The interpolating digital-to-analog converter for a TFT-LCD source driver as claimed in claim 1, wherein said interpolating buffer comprises:

a first operational amplifier having a first output terminal, a first positive input terminal for receiving said first reference voltage and a first negative input terminal for coupling to said first output terminal; and a second operational amplifier having a second output terminal coupled to said first output terminal, a second positive input terminal for receiving said second reference voltage, and a second negative input terminal coupled to said first output terminal.

5. The interpolating digital-to-analog converter for a TFT-LCD source driver as claimed in claim 1 further comprising:

a plurality of data registers for receiving said digital video signals in response to a system clock signal;

a plurality of shift control registers for sequentially enabling said plurality of data registers for receiving said digital video signals in response to said system clock signal; and latching means for latching said digital video signals from said plurality of data registers in response to a latch signal.

6. A TFT-LCD source driver for driving a TFT-LCD pixel array comprising:

a plurality of data registers for receiving digital video signals in response to a system clock signal;

a plurality of shift control registers for sequentially enabling said plurality of data registers for receiving said digital video signals in response to said system clock signal;

latching means for latching said digital video signals from said plurality of data registers in response to a latch signal;

a reference voltage generator for generating a plurality of reference voltages;

a decoding switch network coupled to said reference voltage generator for selecting two reference voltages from said plurality of reference voltages in response to a plurality of high bits of said digital video signals;

a routing switch coupled to said decoding switch network for selectively providing a first reference voltage and a second reference voltage in response to a plurality of low bits of said digital video signals; and an interpolating buffer coupled to said routing switch for outputting an interpolated analog signal in response to said first reference voltage and said second reference voltage.

7. A method for providing interpolated analog signals for a TFT-LCD source driver comprising the steps of:

generating a plurality of reference voltages in response to the resolution of said TFT-LCD source driver;

receiving a plurality of high bits of digital video signals and selecting a first subset of reference voltages from said plurality of reference voltages in response to said plurality of high bits of digital video signals;

selectively routing said first subset of reference voltages in response to a plurality of low bits of said digital video signals to generate a second subset of reference voltages; and outputting an interpolated analog signal in response to said second subset of reference voltages.

8. An interpolating buffer for an interpolating digital-to-analog converter comprising:

a plurality of transistors, each having a gate terminal for receiving a reference voltage from a plurality of reference voltages;

a load circuit having a first input terminal coupled to each drain terminal of said plurality of transistors;

a feedback transistor having a gate terminal coupled to an output terminal of said load circuit and having a drain terminal coupled to a second input terminal of said load circuit; and a current source having a first terminal coupled to a fixed voltage level and a second terminal electrically coupled to each source terminal of said plurality of transistors and a source terminal of said feedback transistor.

9. The interpolating buffer for an interpolating digital-to-analog converter as claimed in claim 8, further comprising:

a reference voltage generator for generating said plurality of reference voltages.

10. The interpolating buffer for an interpolating digital-to-analog converter as claimed in claim 9, further comprising:

a decoding switch network coupled to said reference voltage generator for selecting a subset of reference voltages from said plurality of reference voltages in response to a plurality of high bits of digital video signals.

11. The interpolating buffer for an interpolating digital-to-analog converter as claimed in claim 10, further comprising:

a routing switch coupled to said decoding switch network for selectively routing said subset of reference voltages in response to a plurality of low bits of said digital video signals.

* * * * *